US010852758B2

(12) United States Patent
Mahadik

(10) Patent No.: US 10,852,758 B2
(45) Date of Patent: Dec. 1, 2020

(54) REFERENCE VOLTAGE GENERATOR

(71) Applicant: INFINEON TECHNOLOGIES AUSTRIA AG, Villach (AT)

(72) Inventor: Salil A. Mahadik, Copenhagen NV (DK)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 16/238,776

(22) Filed: Jan. 3, 2019

(65) Prior Publication Data

US 2020/0218299 A1 Jul. 9, 2020

(51) Int. Cl.
*G05F 3/08* (2006.01)
*G05F 3/16* (2006.01)
(Continued)

(52) U.S. Cl.
CPC ......... *G05F 1/575* (2013.01); *H03F 3/45071* (2013.01); *H03F 2200/129* (2013.01);
(Continued)

(58) Field of Classification Search
CPC ....... H03F 3/45071; H03F 2203/45514; H03F 2200/129; H03F 2200/156;
(Continued)

(56) References Cited

U.S. PATENT DOCUMENTS 5,059,820 A * 10/1991 Westwick ................ G05F 3/30
323/314
5,352,972 A * 10/1994 Pernici ................ G11C 27/026
323/313
(Continued)

FOREIGN PATENT DOCUMENTS

EP 0 070 315 B1 9/1986

OTHER PUBLICATIONS

Banba, et al, "A CMOS Bandgap Reference Circuit with Sub-1-V Operation", May 1999, pp. 670-674, IEEE Journal of Solid-State Circuits, vol. 35, No. 5.
(Continued)

*Primary Examiner* — Kenneth B Wells
(74) *Attorney, Agent, or Firm* — Armis IP Law, LLC

(57) ABSTRACT

A reference voltage generator comprises: an amplifier; a capacitor network including one or more capacitors; and a switch control circuit to control connectivity of the capacitor network with respect to the input/output nodes of the amplifier. During operation, the switch control circuit controls connectivity of a first capacitor (in the capacitor network) in and out of a feedback path of the amplifier to produce a substantially constant reference voltage. For example, the reference voltage generator provides input offset voltage correction of the amplifier via repeatedly switching between: i) a first mode in which the first capacitor is absent from the feedback path of the amplifier during charging of the first capacitor, and ii) a second mode of inserting the charged first capacitor into the feedback path of the amplifier. Correction of the input offset voltage of the amplifier results in generation of a more accurate reference voltage over temperature.

29 Claims, 15 Drawing Sheets

(51) Int. Cl.
*G05F 3/20* (2006.01)
*G05F 3/26* (2006.01)
*G05F 1/575* (2006.01)
*H03F 3/45* (2006.01)

(52) U.S. Cl.
CPC ............... *H03F 2200/156* (2013.01); *H03F 2203/45116* (2013.01); *H03F 2203/45512* (2013.01); *H03F 2203/45514* (2013.01)

(58) Field of Classification Search
CPC . H03F 2203/45116; H03F 2203/45512; G05F 1/575
See application file for complete search history.

(56) References Cited

U.S. PATENT DOCUMENTS

| | | | |
|---|---|---|---|
| 5,867,012 A | 2/1999 | Tuthill | |
| 5,945,871 A | 8/1999 | Kausel et al. | |
| 5,982,221 A | 11/1999 | Tuthill | |
| 6,097,239 A | 8/2000 | Miranda et al. | |
| 6,819,163 B1 | 11/2004 | Gregoire, Jr. | |
| 7,009,373 B1 | 3/2006 | Garavan | |
| 7,112,948 B2 * | 9/2006 | Daly | G05F 3/30 323/316 |
| 7,236,047 B2 * | 6/2007 | Tachibana | G05F 3/30 327/539 |
| 8,461,912 B1 * | 6/2013 | Kumar | G05F 3/30 327/539 |
| 8,461,921 B2 | 6/2013 | Kumar | |
| 9,013,231 B1 * | 4/2015 | Manea | G05F 3/30 327/539 |
| 2018/0074533 A1 | 3/2018 | Kamath et al. | |

OTHER PUBLICATIONS

Peng, et al., "An offset-insensitive switched-capacitor bandgap reference with continuous output", Aug. 2009, 1-4, Pages vol. 30, No. 8 Journal of Semiconductors.
Wiessflecker, et al., "A sub 1V self clocked switched capacitor bandgap reference with a current consumption of 180nA", 2012, pp. 2841-2844.
Klimach, et al., "A resistorless switched bandgap voltage reference with offset cancellation", May 24, 2014, pp. 6.
Torelli, et al., "Tracking switched-capacitor CMOS current reference" Feb. 1998, pp. 44-47, IEE Proc.—Circuits Devices Syst., vol. 145, No. 1.
Ge, et al., "A Single-Trim CMOS Bandgap Reference With a 3σ Inaccuracy of +/− 0.15% From −40 C to 125 C", Nov. 2011, pp. 2693-2701, IEEE Journal of Solid-State Circuits, vol. 46, No. 11.
Chun, et al, "A Low-power, Small-area and Programmable Bandgap Reference", 2012, pp. 510-513.
Nicollini, et al., "A CMOS Bandgap Reference for Differential Signal Processing", Jan. 1991, pp. 41-50, IEEE Journal of Solid-State Circuits, vol. 26, No. 1.
Johns, et al., "Switched-Capacitor Circuits" University of Toronto, 1997, pp. 30.
EP Search Report, EP 19 21 7070, dated May 29, 2020, pp. 1-14.
EP Extended Search Report, EP 19217070.2, dated Sep. 21, 2020, pp. 1-26.

* cited by examiner

REFERENCE VOLTAGE GENERATOR

BACKGROUND

A conventional reference voltage generator is a circuit that produces a substantially constant output reference voltage. Such circuit can be used for any number of reasons such as generation of a power supply voltage, measurements with respect to a threshold value, etc.

One type of reference voltage generator is a so-called bandgap reference voltage generator. In general, a conventional bandgap voltage reference generator is a temperature independent voltage reference circuit widely used in integrated circuits. During operation, the conventional bandgap voltage reference generator produces a fixed output voltage regardless of power supply variations, temperature changes, and circuit loading from a device.

A conventional bandgap reference voltage generator commonly has an output voltage around 1.25 VDC.

Conventional bandgap reference voltage generators can include any number of active or passive circuit components such as resistors, capacitors, inductors, transformers, operational-amplifiers, etc., to generate a respective output voltage.

BRIEF DESCRIPTION

One drawback of the conventional reference voltage generator implemented via an operational amplifier is the input offset voltage. In general, the input offset voltage is a parameter defining the differential DC voltage required between the inputs (inverting and non-inverting inputs) of an amplifier to control the output of the amplifier to zero volts. If left uncorrected, the input offset voltage of a respective operational amplifier may result in undesirable errors in the corresponding reference output voltage, resulting in overall poor circuit performance.

In contrast to conventional approaches, embodiments herein include novel ways of providing improved generation of a constant or substantially fixed reference voltage.

More specifically, one embodiment herein includes an electronic device (such as a reference voltage generator) comprising: an amplifier; a capacitor network including one or more capacitors; and a switch control circuit to control connectivity of the capacitor network with respect to the amplifier input/output.

During operation, the switch control circuit controls connectivity of a first capacitor (of the capacitor network) in and out of a feedback path of the amplifier to produce a substantially constant reference voltage. For example, in a specific implementation, the reference voltage generator as described herein is operable to provide input offset voltage correction of the amplifier via repeatedly switching between: i) a first mode in which the first capacitor is absent from the feedback path of the amplifier such as during charging of the first capacitor, and ii) a second mode of inserting the charged first capacitor into the feedback path of the amplifier.

In one embodiment, as further discussed herein, conservation of charge in the capacitor network that occurs when switching between the first mode and the second mode provides a way to reduce inaccuracies of producing the reference voltage otherwise caused by the input offset voltage.

Note that, according to one embodiment, the reference voltage generator and corresponding components take the form of circuitry. However, such resources/components can be instantiated in any suitable manner.

In accordance with still further embodiments, while in the first mode, the switch control circuit is operable to configure the amplifier in a unity gain mode in which an output of the amplifier is coupled to an inverting input of the amplifier. While in the second mode, the switch control circuit is operable to configure the amplifier to operate in a gain mode in which the first capacitor is coupled in the feedback path such as between the inverting input of the amplifier and the output of the amplifier.

In yet further embodiments, the reference voltage generator as described herein includes a first semiconductor device and a first current driver. The reference voltage generator circuit also includes a second semiconductor device and a second current driver.

In one embodiment, while in the first mode, the switch control circuit is operable to couple the first current driver to the first semiconductor device. In such an instance, the first current driver supplies (or drives) first current through a first semiconductor device during the first mode to generate a first voltage that is inputted to a non-inverting input of the amplifier; a second current driver supplies (or drives) second current through the second semiconductor device during the first mode to generate a second voltage that is used at least in part to charge the first capacitor. In one embodiment, the amplifier is operated in a unity gain mode during the first mode.

While operating in the second mode, the switch control circuit is operable to couple the second current driver to the first semiconductor device. The first current driver is potentially deactivated and/or disconnected from the first semiconductor device. In such an instance, the second current driver supplies the second current through the first semiconductor device to generate a third voltage that is inputted to non-inverting input of the amplifier. Further, in the second mode, the first capacitor is connected between the output of the amplifier and the inverting input of the amplifier.

Note that the first semiconductor device and the second semiconductor device can be of the same type (such as a bipolar junction transistor or other suitable component); an area factor associated with the first semiconductor device and the second semiconductor device can be substantially equal such that the devices are matched in type and size.

In one or more embodiments, the first current driver output is operable to output a first substantially constant current during the first mode and the second mode. Recall that during the first mode, the first current driver outputs current to the first semiconductor device; during the second mode, the first current driver outputs current to the second semiconductor device. In one embodiment, the second current driver output is operable to output a second constant or substantially fixed current during the first mode. By further way of non-limiting example embodiment, the fixed current outputted from the first driver (in both the first and second mode) is substantially greater than the fixed current outputted by the second driver circuit (in the first mode).

Further embodiments of the reference voltage generator as described herein include a biasing circuit operable to switch between driving the first current driver and the second current driver based on a first bias signal and a second bias signal. In one embodiment, the first bias signal is used to initialize (start or ramp up) operation of the reference voltage generator to produce the reference voltage; the second bias signal is applied after initialization and varies depending on a magnitude of the reference voltage generated by the amplifier.

In still further embodiments, a magnitude of the reference voltage is substantially constant over a range of temperature.

By way of non-limiting example embodiment, the magnitude of the reference voltage is less than 1 VDC (Volts DC). However, the magnitude of the reference voltage can be any suitable value.

In accordance with further embodiments, in addition to the first capacitor selectively inserted into a feedback path of the amplifier, note that the network of capacitors can be configured to include a second capacitor and a third capacitor. In one nonlimiting example embodiment, each of the first capacitor, the second capacitor, and the third capacitor are coupled to an inverting input of the amplifier. As further discussed herein, during the first mode, the switch control circuit connects the first capacitor and the second capacitor in parallel; during the second mode when the first capacitor is inserted in the feedback path, the second capacitor and the third capacitor are connected in parallel.

These and other more specific embodiments are disclosed in more detail below.

Note further that, although embodiments as discussed herein are applicable to amplifier circuitry and/or reference voltage generators, the concepts disclosed herein may be advantageously applied to any other suitable topologies.

Note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

Figure 1:
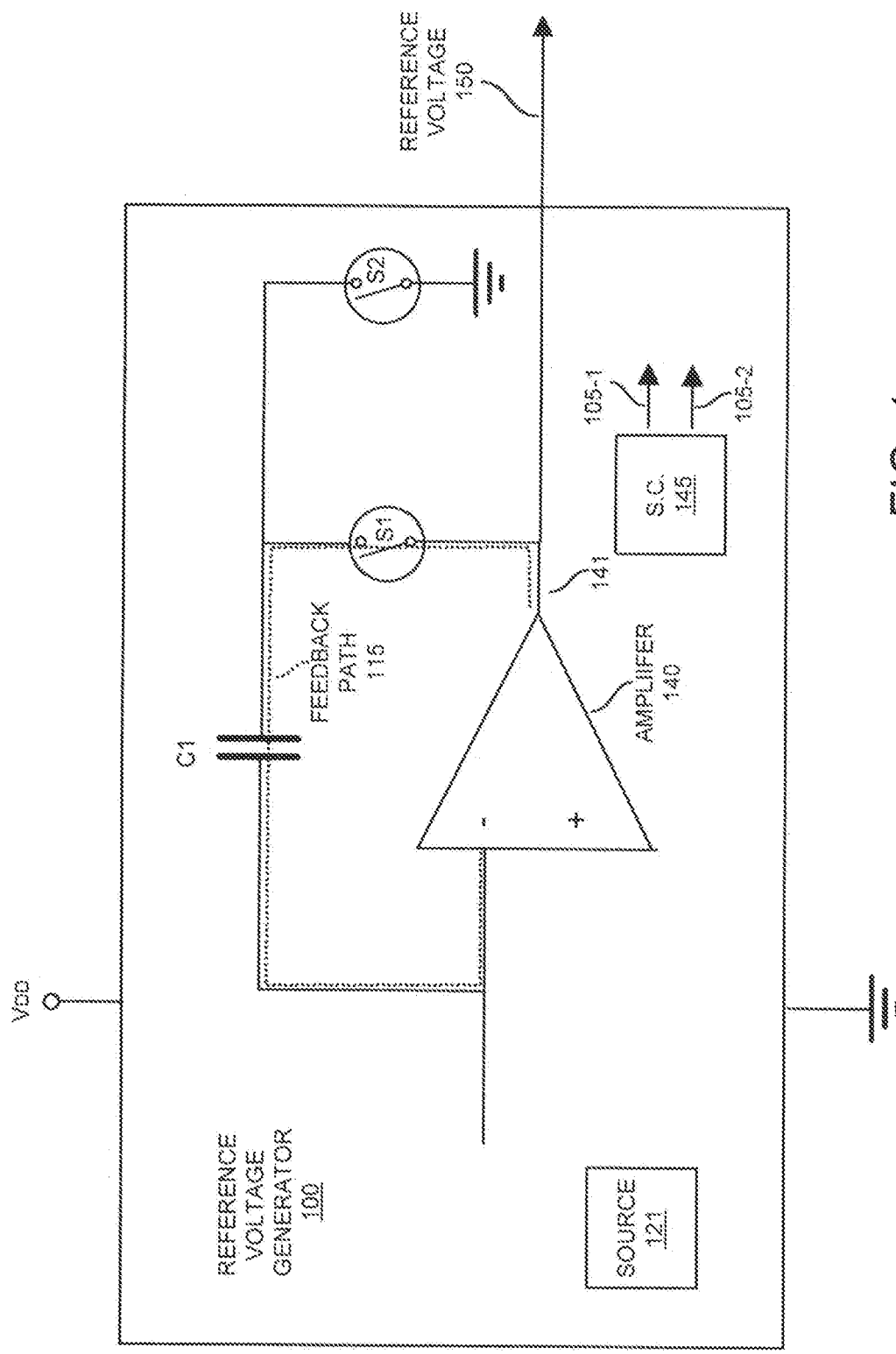
FIG. 1 is an example diagram illustrating a reference voltage generator according to embodiments herein.

The foregoing and other objects, features, and advantages of embodiments herein will be apparent from the following more particular description herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

Now, more specifically, FIG. 1 is an example diagram illustrating implementation of a reference voltage generator according to embodiments herein.

As shown in this example embodiment, the reference voltage generator 100 (such as an electronic device, circuit, etc.) includes an amplifier 140, current source 121, capacitor C1, switch controller 145, and switches S1 and S2.

In this general embodiment, a first node of the capacitor C1 is coupled to the inverting input of the amplifier 140. The second node of the capacitor C1 is coupled to switches S1 and S2.

Depending on a current operational mode, switch S1 selectively couples the capacitor C1 to the output 141 of amplifier 140; switch S2 selectively couples the capacitor C1 to a ground reference voltage.

More specifically, during operation, switch controller 145 produces control signals 105 (such as control signal 105-1 and control signal 105-2) to control a state of respective switches S1 and S2. Current source 121 outputs current to charge the capacitor C1 depending on a current phase of a repetitive control cycle in which the reference voltage generator 100 is operated. Amplifier 140 produces reference voltage 150.

Further, note that when generating the reference voltage 150, the switch controller 145 controls connectivity of capacitor C1 (such as one capacitor of multiple capacitors in a capacitor network) in and out of a feedback path 115 (such as between the output 141 of the amplifier 140 and the inverting input node (−)) of the amplifier 140 to produce a substantially constant reference voltage 150.

As a more specific example, in one embodiment, the switch controller 145 of the reference voltage generator 100 is operable to provide input offset voltage correction of the amplifier 140 via repeatedly switching between: i) a first mode in which the capacitor C1 is absent or removed from the feedback path 115 of the amplifier 140 during charging of the capacitor C1, and ii) a second mode of inserting the capacitor C1 into the feedback path 115 of the amplifier 140.

During the first mode, as will be further discussed later in this specification, to remove the capacitor C1 from the feedback path 115, the switch controller 145 produces the control signal 105-1 such that switch S1 is open; the switch controller 145 produces the control signal 105-2 such that switch S2 is closed.

Conversely, to insert the capacitor C1 into the feedback path 115, as will be further discussed later in this specification, the switch controller 145 produces the control signal 105-1 such that switch S1 is closed; the switch controller 145 produces the control signal 105-2 such that switch S2 is open.

For sake of clarity, note that opening of a respective switch means that the respective switch (such as S1 or S2) provides an open circuit or high impedance path; closing of a respective switch means that the respective switch provides a closed circuit path or low impedance path.

Note further that, according to one embodiment, the reference voltage generator 100 and corresponding components take the form of circuitry. However, such components and circuitry can be instantiated in any suitable manner.

In one embodiment, the reference voltage generator 100 is a so-called bandgap reference voltage generator; however, the reference voltage generator 100 can be any suitable type of electronic device operable to produce a respective reference voltage 150.

In still further embodiments, as further discussed and shown below, note that a magnitude of the reference voltage 150 generated by the amplifier 140 is substantially constant over a range of temperature.

By further way of non-limiting example embodiment, the magnitude of the reference voltage 150 generated by the reference voltage generator 100 is less than 1 VDC (Volts DC). However, note that parameters of the reference voltage generator 100 can be adjusted such that the magnitude of the reference voltage 150 is any desired value (greater than or less than 1 VDC).

Figure 2A:
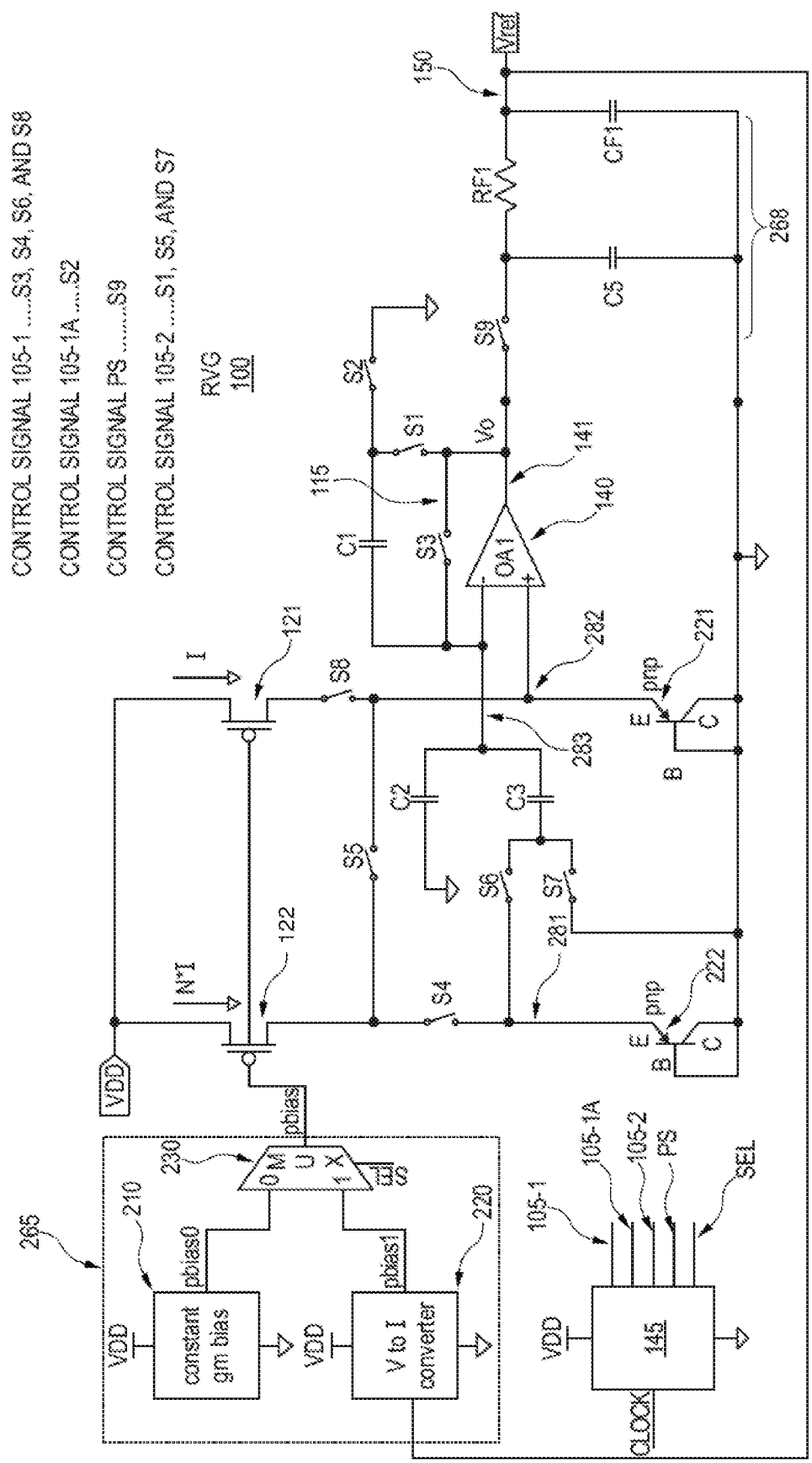
FIG. 2A is an example diagram illustrating a detailed circuit implementing a reference voltage generator according to embodiments herein.

FIG. 2A is an example diagram illustrating a more specific implementation of a reference voltage generator according to embodiments herein.

As shown in FIG. 2A, the example reference voltage generator 100 includes a bias circuit 265, switch controller 145, amplifier 140, current source 121, current source 122, component 221 (such as a first semiconductor device), component 222 (such as a second semiconductor device), capacitor C1, capacitor C2, and capacitor C3.

In one embodiment, as further discussed herein, a value of capacitor C3 is selected (such as fixed value) for the reference voltage generator 100. Embodiments herein further include selecting a value of capacitor C2 to adjust a temperature coefficient (to provide first order temperature compensation) of generating the reference voltage 150 across a range of different temperature values. A magnitude of capacitor C3 is chosen to control a magnitude of the reference voltage 150.

In this example embodiment, bias circuit 265 of the reference voltage generator 100 includes bias resource 210, bias resource 220, and multiplexer 230.

Switch controller 145 of the reference voltage generator 100 produces control signals 105-1, 105-1A, 105-2, PS, and SEL.

The reference voltage generator 100 further includes switches S1, S2, S3, S4, S5, S6, S7, S8, and S9. In general, as further discussed herein, the switch controller 145 controls the state of the respective switches between a first operational phase and a second operational phase.

In this example embodiment, the switch controller 145 generally generates the controls signal 105-1 and control signal 105-1A to be a logic high when the control signal 105-2 is a logic low. Conversely, the switch controller 145 generates the controls signal 105-1 to be a logic low when the control signal 105-2 is a logic high.

As a further example, control signal 105-1 generated by the switch controller 145 controls a state of switches S3, S4, S6 and S8. Control signal 105-1A generated by the switch controller 145 controls a state of switch S2. Control signal 105-2 (such as an inverse of control signal 105-1) generated by the switch controller 145 controls a state of switches S1, S5, and S7. Control signal PS controls a state of sampling switch S9. Different states of controlling the switches and corresponding reference voltage 150 in different phases is further discussed below in FIGS. 3-7. Note that there is a dead time between transitions associated with control signals 105-1 and 105-2.

Figure 2B:
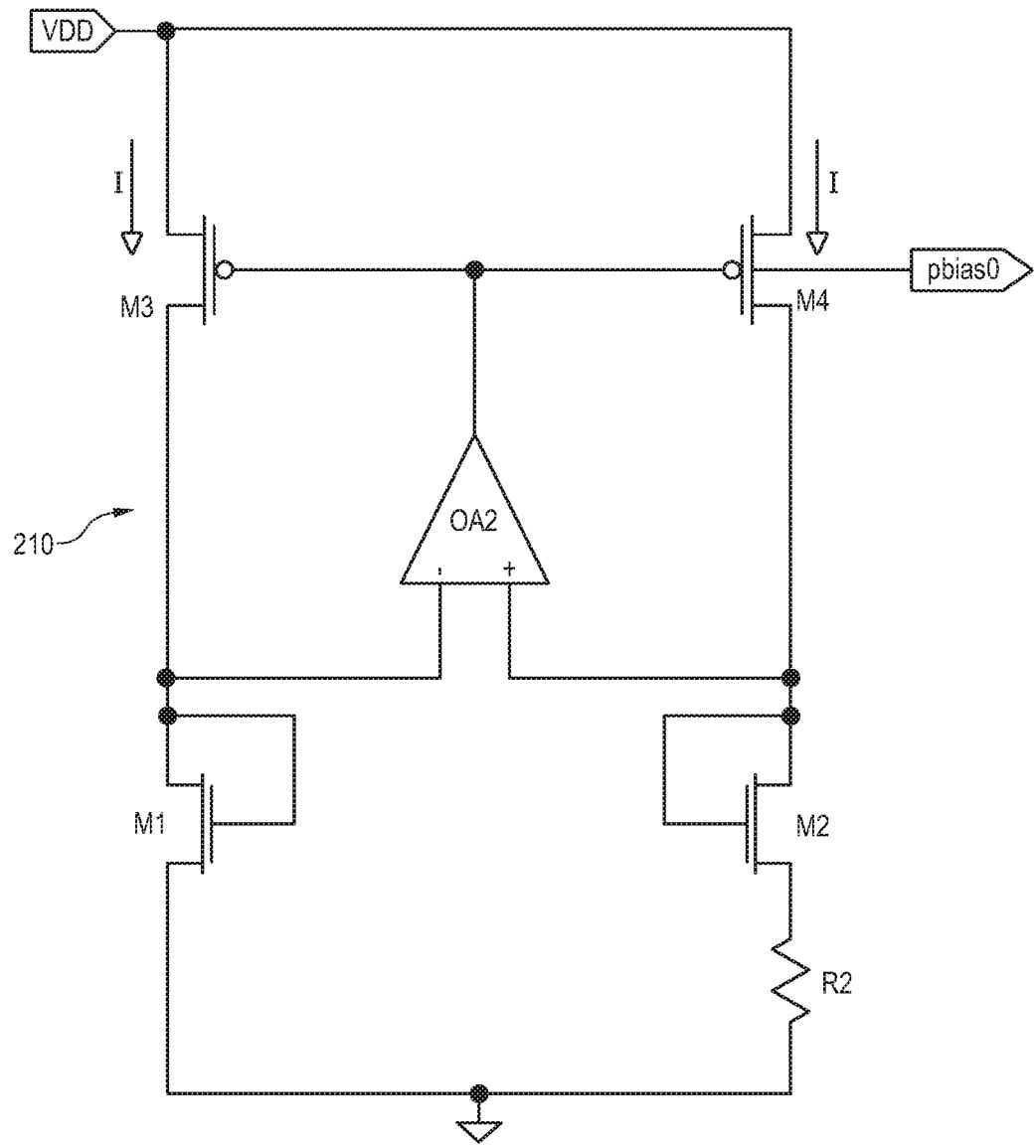
FIG. 2B is an example diagram illustrating a bias circuit according to embodiments herein.

FIG. 2B is an example diagram illustrating a constant gm bias circuit according to embodiments herein.

In this example embodiment, the bias circuit 210 includes amplifier OA2 and transistors M1, M2, M3, and M4. Bias circuit 210 receives input voltage VDD and produces bias voltage pbias0. In one embodiment, the transistor M2 is 4 times the size of transistor M1.

Figure 2C:
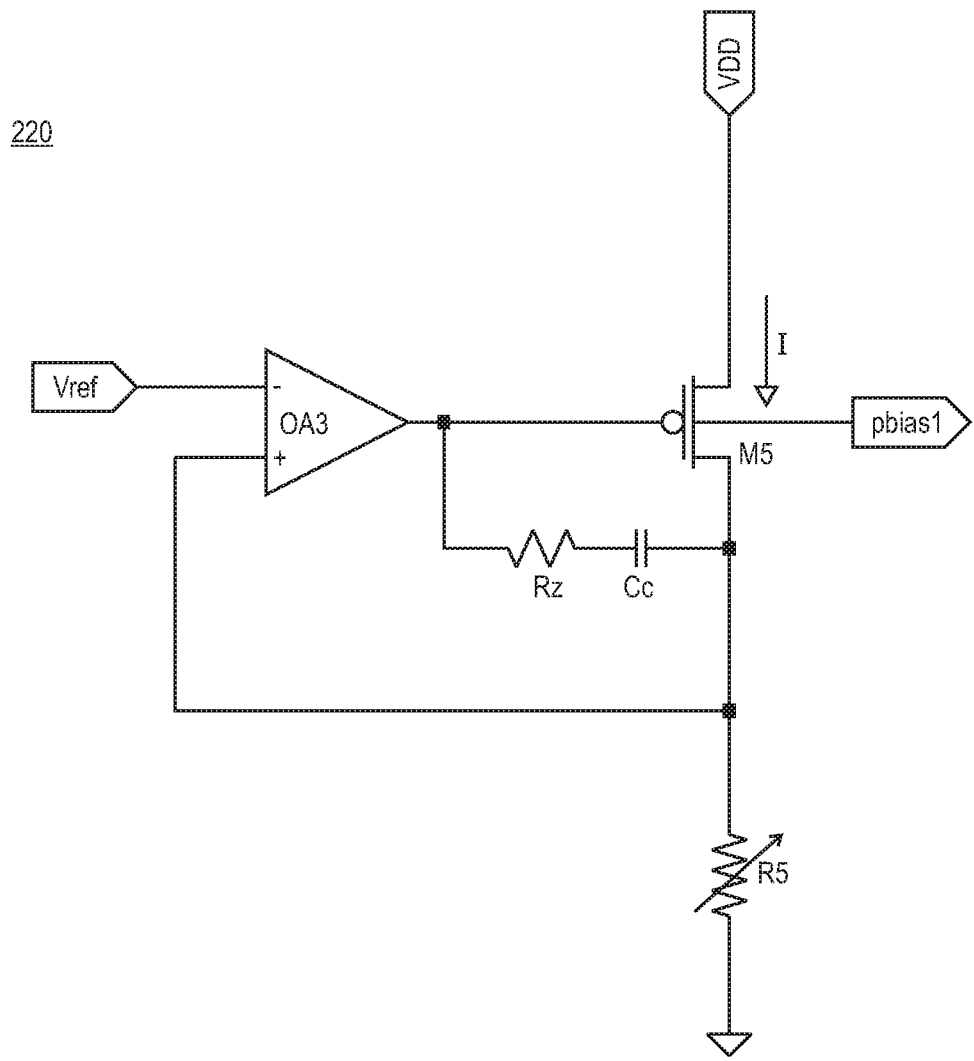
FIG. 2C is an example diagram illustrating bias circuitry according to embodiments herein.

FIG. 2C is an example diagram illustrating bias circuit according to embodiments herein.

In this example embodiment, the bias circuit 220 includes amplifier OA3, transistor M5, resistor R5, resistor Rz, and capacitor Cc. Resistor Rz and capacitor Cc are present for stability in circuit 220. Bias circuit 220 receives input voltage Vref and produces bias voltage pbias1. In one embodiment, the transistor M5 is fabricated with substantially the same parameters (size, shape, type, etc.) as current driver 121 and 122.

Amplifier OA3 operates in a balanced state in which the voltage of the inverting input equals a voltage of the non-inverting input. The bias circuit generates control signal PBIAS1.

Referring again to FIG. 2A, note further that the output circuit 268 of the reference voltage generator 100 includes switch S9, capacitor C5, resistor RF1, and capacitor CF1. The switch controller 145 controls switch S9 (ON and OFF at appropriate times via signal PS) to sample the output voltage (Vo) of the amplifier 140 and output it through the low pass filter (combination of resistor RF1 and capacitor CF1) to generate the reference voltage 150.

Based on a state of the select signal (SEL) generated by the switch controller 145, the multiplexer 230 switches between i) connecting the output PBIAS0 of bias resource 210 to the current drivers 121 and 122, and ii) connecting the output PBIAS1 of bias resource 220 to the current drivers 121 and 122.

Figure 3A:
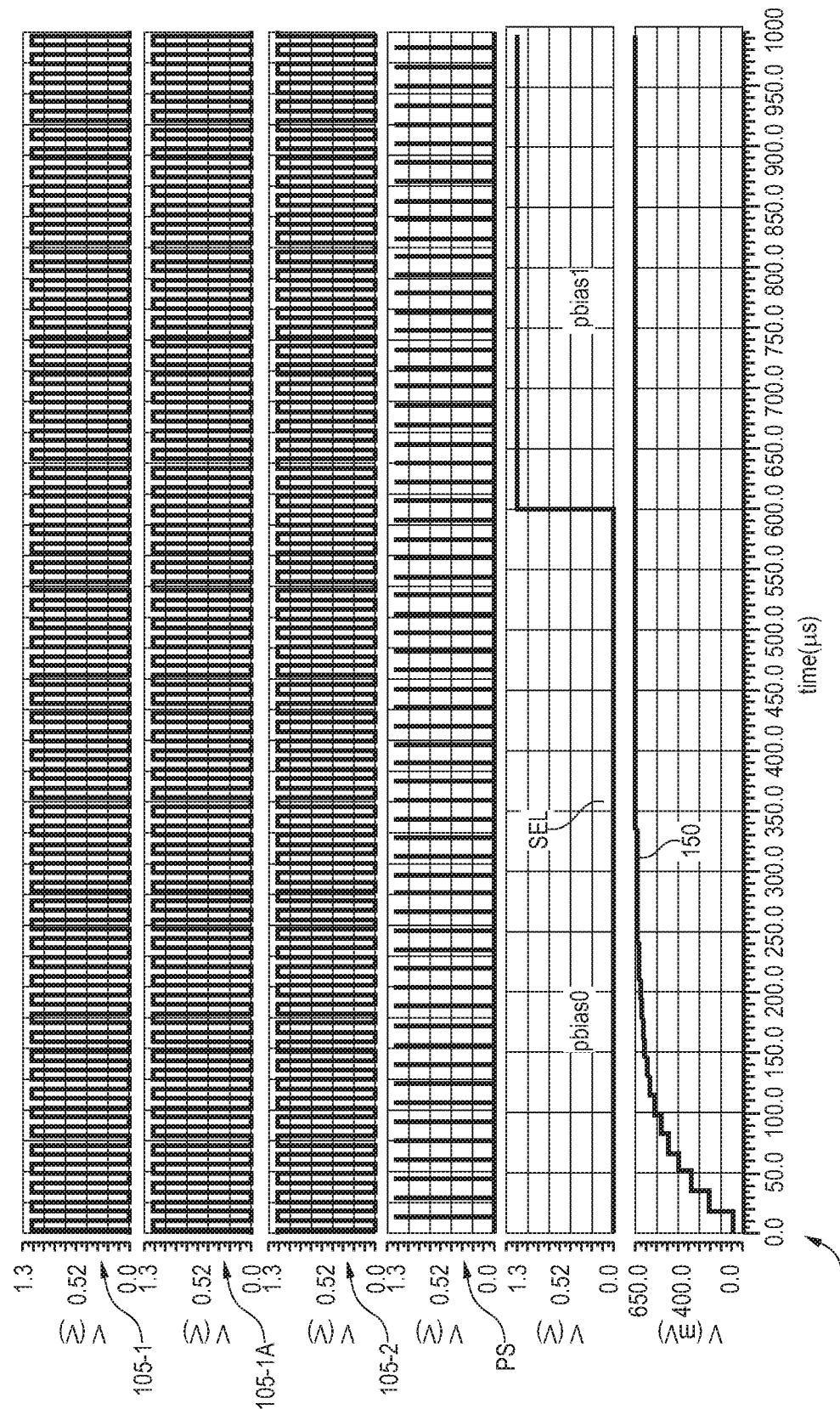
FIG. 3A is an example timing diagram illustrating control settings of the reference voltage generator and generation of a respective reference voltage according to embodiments herein.

FIG. 3A is an example diagram illustrating timing of generating control signals 105-1, 105-1A, 105-2, PS, and SEL according to embodiments herein.

More specifically, in one embodiment, as shown in graph 300 of FIG. 3A, before time=600 microseconds, when signal SEL=0, the mux 230 feeds the first bias signal (such as PBIAS0 generated by the bias resource 210) to drive current drivers 121 and 122 to initialize or start operation of the reference voltage generator 100 to ramp up and produce the reference voltage 150. After time T=600 microseconds, when the reference voltage 150 reaches a steady state, the mux 230 feeds the second bias signal (such as signal PBIAS1 generated by the bias resource 220) to drive current drivers 121 and 122.

Figure 3B:
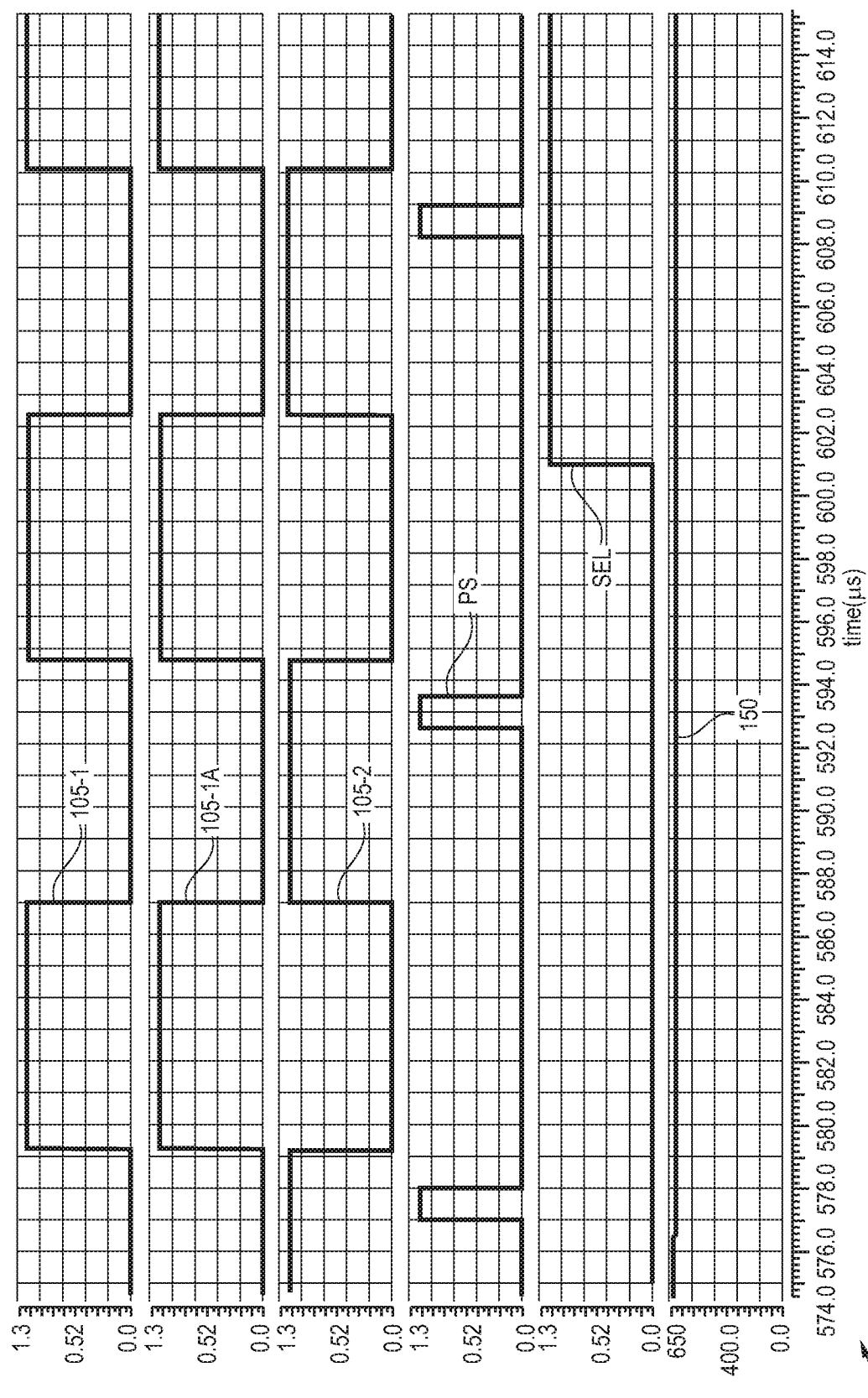
FIG. 3B is an example timing diagram illustrating control settings of the reference voltage generator and generation of a respective reference voltage according to embodiments herein.

FIG. 3B is a more detailed example diagram (graph 310) illustrating timing of control signals 105-1, 105-1A, 105-2, PS, and SEL according to embodiments herein.

Figure 3C:
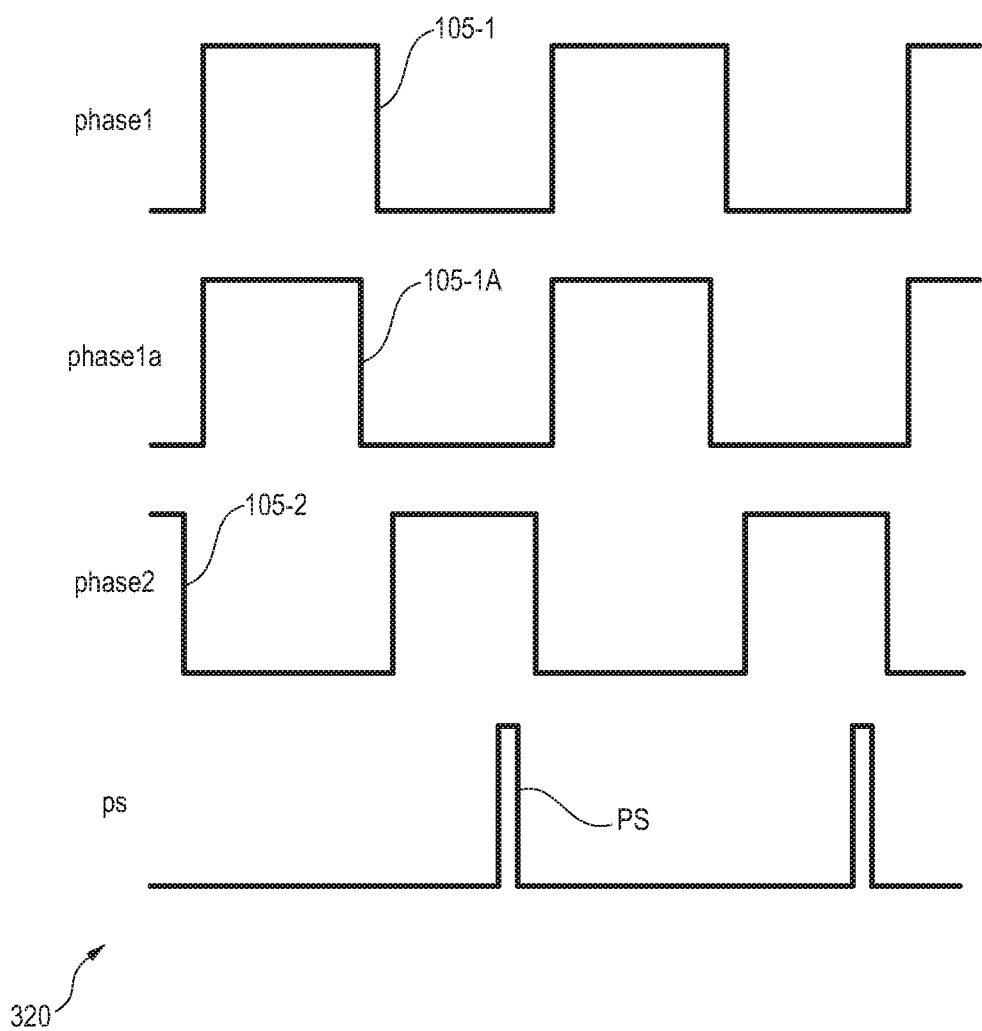
FIG. 3C is an example timing diagram illustrating control settings of the reference voltage generator and generation of a respective reference voltage according to embodiments herein.

FIG. 3C is a more detailed example diagram (graph 320) illustrating timing of control signals 105-1, 105-1A, 105-2, and PS, according to embodiments herein.

Referring again to FIG. 2A, in one non-limiting example embodiment, the current drivers 121 and 122 are transistors controlled by an applied bias voltage PBIAS0 or PBIAS1. In such an instance, the current outputted by such current devices depends on a magnitude of a respective input voltage (such as reference voltage 150 or constant gm voltage bias).

Note that implementation of the current drivers 121 and 122 is shown by way of nonlimiting example only. Note that the current drivers 121 and 122 can be any suitable type of device to produce respective drive currents N×I and I, where N is any suitable value. For example, if I=6 microamps, and N=6, then N×I=36 microamps.

In accordance with further embodiments, the current driver 121 outputs a first substantially constant current (such as I). The current driver 122 outputs a second substantially constant current (such as N×I).

In one embodiment, for N=6 (in which current from source 122 is 6 times greater than current from source 121), the capacitor values can be set to C3=0.5 pF, C1=1 pF and C2=3.8 pF to obtain a good temperature coefficient in which the magnitude of the reference voltage 150 is substantially the same at different temperatures to which the reference voltage generator 100 is exposed.

Note further that the first component 221 (such as a semiconductor device) and the second component 222 (such as a semiconductor device) can be of the same type; an area factor associated with the first component 221 and the second component 221 can be substantially equal such that the components (as semiconductor devices) are matched in type and size.

In one nonlimiting example embodiment as shown in FIG. 2A, the first component 221 is a first bipolar junction transistor. The second component 222 is a second bipolar junction transistor, although the components 221 and 222 can be any suitable component (transistor, diode, etc.) that produces a respective voltage when driven with a corresponding current.

In accordance with further embodiments, when the component 222 is driven with a respective current, the component 222 produces a voltage at node 281. Similarly, when the component 221 is driven with a respective current, the component 221 produces a voltage at node 282 inputted to the respective non-inverting input (+) of the amplifier 140.

As further shown, in addition to the capacitor C1 selectively inserted into a feedback path 115 of the amplifier 140 as previously discussed, the network of capacitors associated with reference voltage generator 100 includes a capacitor C2 and a capacitor C3.

In one nonlimiting example embodiment, as further shown, a respective end terminal of each of the capacitor C1, the capacitor C2, and the capacitor C3 is coupled to an inverting input (−) of the amplifier 140. As further discussed below, during the first mode (such as phase #1) when the capacitor C1 is being charged, the switch control circuit 145 connects the capacitor C1 and the capacitor C2 in parallel to ground; during the second mode (such as phase #2) when the capacitor C1 is inserted in the feedback path 115, the capacitor C2 and the capacitor C3 are connected in parallel.

Further details of switch settings and respective operation of the reference voltage generator 100 are discussed in the following figures.

As previously discussed, FIG. 3A is an example timing diagram illustrating control settings of the reference voltage generator and generation of a respective reference voltage according to embodiments herein.

As shown, and as previously discussed, graph 300 indicates: states of signal 105-1 and 105-1A outputted by the switch controller 145; states of signal 105-2 outputted by the switch controller 145.

In one embodiment, as previously discussed, the control signal 105-2 is generally an inversion of control signal 105-1 and 105-1A, but with dead time around transitions. More specifically, control signal 105-1 controls operation of switches S3, S4, S6, and S8. Control signal 105-1A controls operation of switch S2. Control signal 105-2 controls operation of switches S1, S5, and S7.

Graph 300 in FIG. 3A further illustrates a state of the SEL signal used to control a state of the mux 230. As previously discussed, depending on a state of the SEL signal, the mux 230 drives the current sources 121 and 122 with different bias voltages. For example, when the SEL signal is logic low during startup of the reference voltage generator 100, the mux 230 drives current sources 121 and 122 with voltage PBIAS0; when the SEL signal is logic high, the mux 230 drives current source 121 and current source 122 with voltage PBIAS1.

Further in this example embodiment, the graph 300 in FIG. 3A indicates ramping of the reference voltage 150 during application of the respective control signals 105-1, 105-1A, and 105-2 and signal SEL to reference voltage generator 100.

Figure 4:
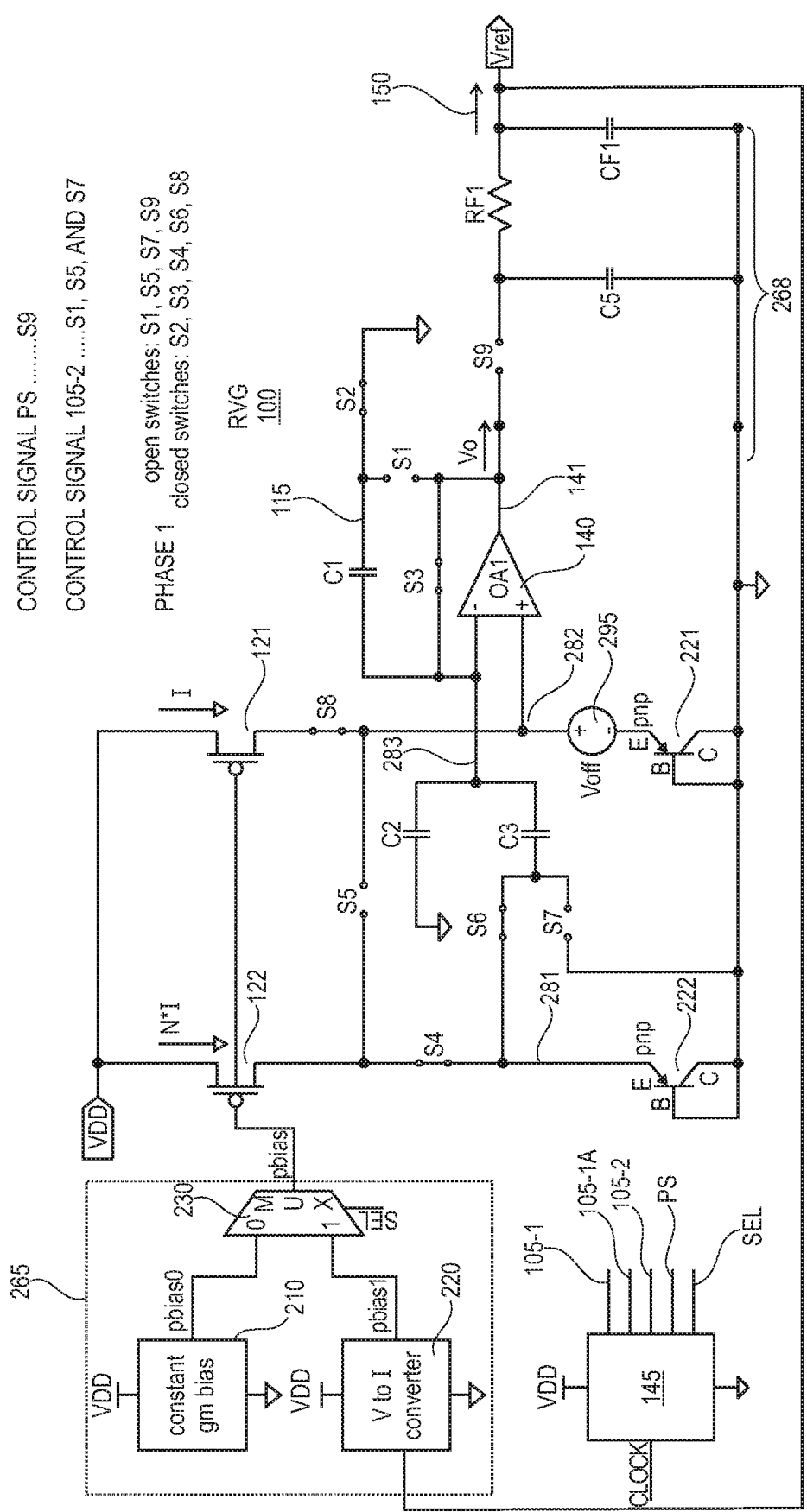
FIG. 4 is an example diagram illustrating operation and software settings of the reference voltage generator in a first mode (phase #1) according to embodiments herein.

FIG. 4 is an example diagram illustrating operation and switch settings of the reference voltage generator in a first mode (phase #1) according to embodiments herein.

More specifically, in the first mode (phase #1), the switch controller 145 produces the control signals 105-1 and 105-1A to close switches S2, S3, S4, S6, and S8; the switch controller 145 produces the control signal 105-2 to open switches S1, S5, and S7.

Note that the source 295 represents an input offset voltage (Voff) of the amplifier 140.

While in the first mode, via the switch settings above in which switch S3 is closed and switch S1 is opened, the switch control circuit 145 configures the amplifier 140 in a unity gain mode in which an output 141 of the amplifier 140 is coupled to an inverting input (−) of the amplifier 140.

Further, while in the first mode, the switch control circuit 145 couples the first current driver 121 to the first component 221 via activation of switch S8. In such an instance, the first current driver 121 supplies (or drives) first current (such as I) through the switch S8 and the first component 221 (such as from respective emitter E to base B of a respective bipolar junction transistor) during the first mode to generate a first voltage Veb(I). Node 282 (connected to non-inverting input of amplifier 140) is set to voltage Veb(I)+Voffset.

Further, during the first operational mode of the reference voltage generator 100, the second current driver 122 supplies (or drives) second current (such as N×I) through the switch S4 and the second component 222 (such as from respective emitter E to base B of a bipolar junction transistor) during the first mode to generate a second voltage Veb(N×I) that is inputted to the capacitor C3 through closed switch S6.

As previously discussed, when switch S3 is closed during phase #1, the amplifier 140 operates in a unity gain mode. Because the amplifier 140 operates in the unity gain (or buffer) mode, the inverting input (−) of the amplifier 140 is Veb(I)+Voffset.

Figure 5:
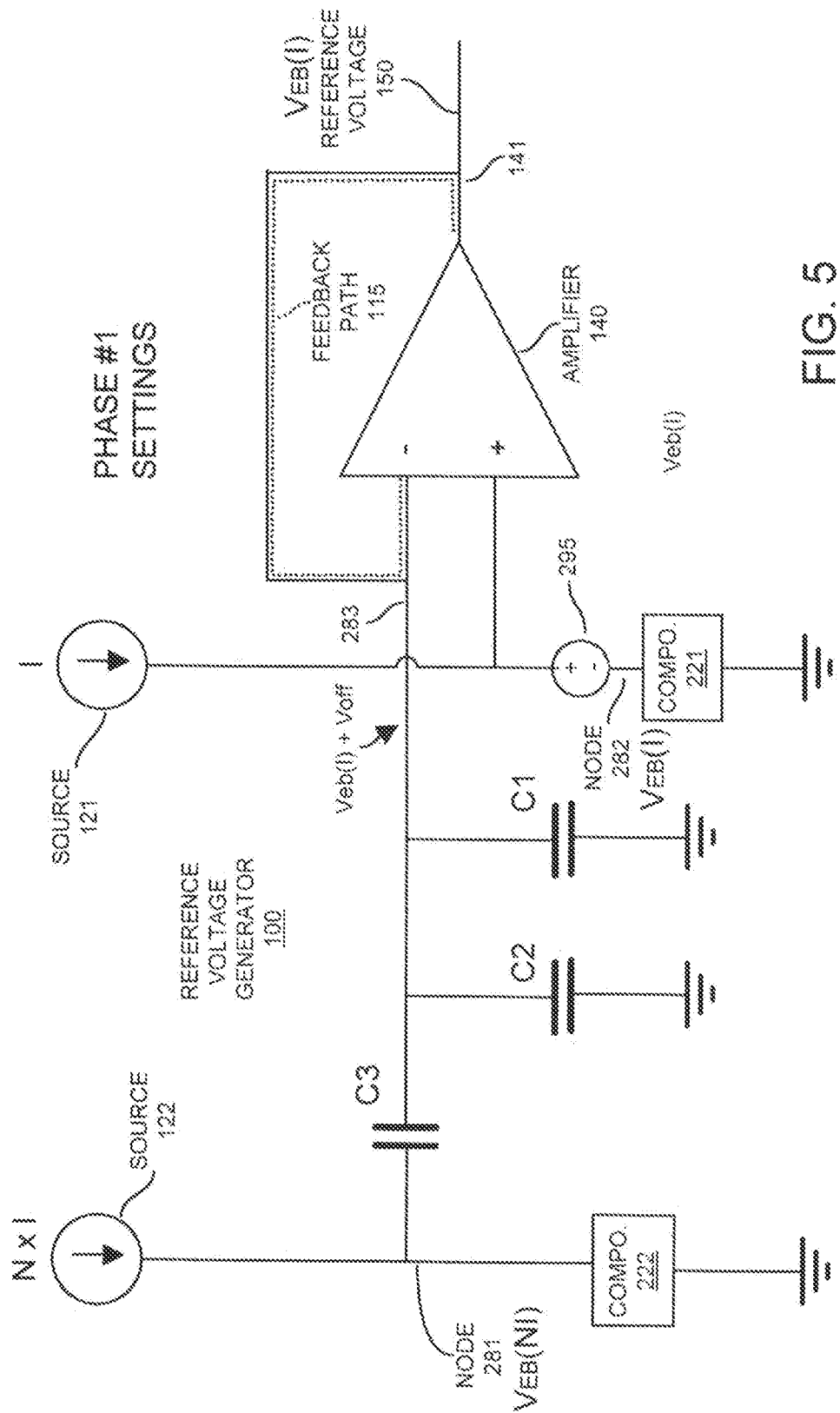
FIG. 5 is an example diagram illustrating connectivity of components in the reference voltage generator during the first mode (phase #1) according to embodiments herein.

FIG. 5 is an example diagram illustrating connectivity of components in the reference voltage generator during the first mode (phase #1) according to embodiments herein.

As previously discussed, while in the first mode, the capacitors C1 and C2 are connected in parallel to ground. Capacitor C3 is coupled between the node 281 and the inverting input of the amplifier 140.

Charge Q of a capacitor equals the voltage across the capacitor multiplied by the capacitance of the capacitor.

During phase #1, recall that the voltage at the inverting node of the amplifier 140 is Veb(I)+Voffset. Because the amplifier 140 operates in the unity gain mode, the inverting input of the amplifier 140 is Veb(I)+Voffset.

Figure 6:
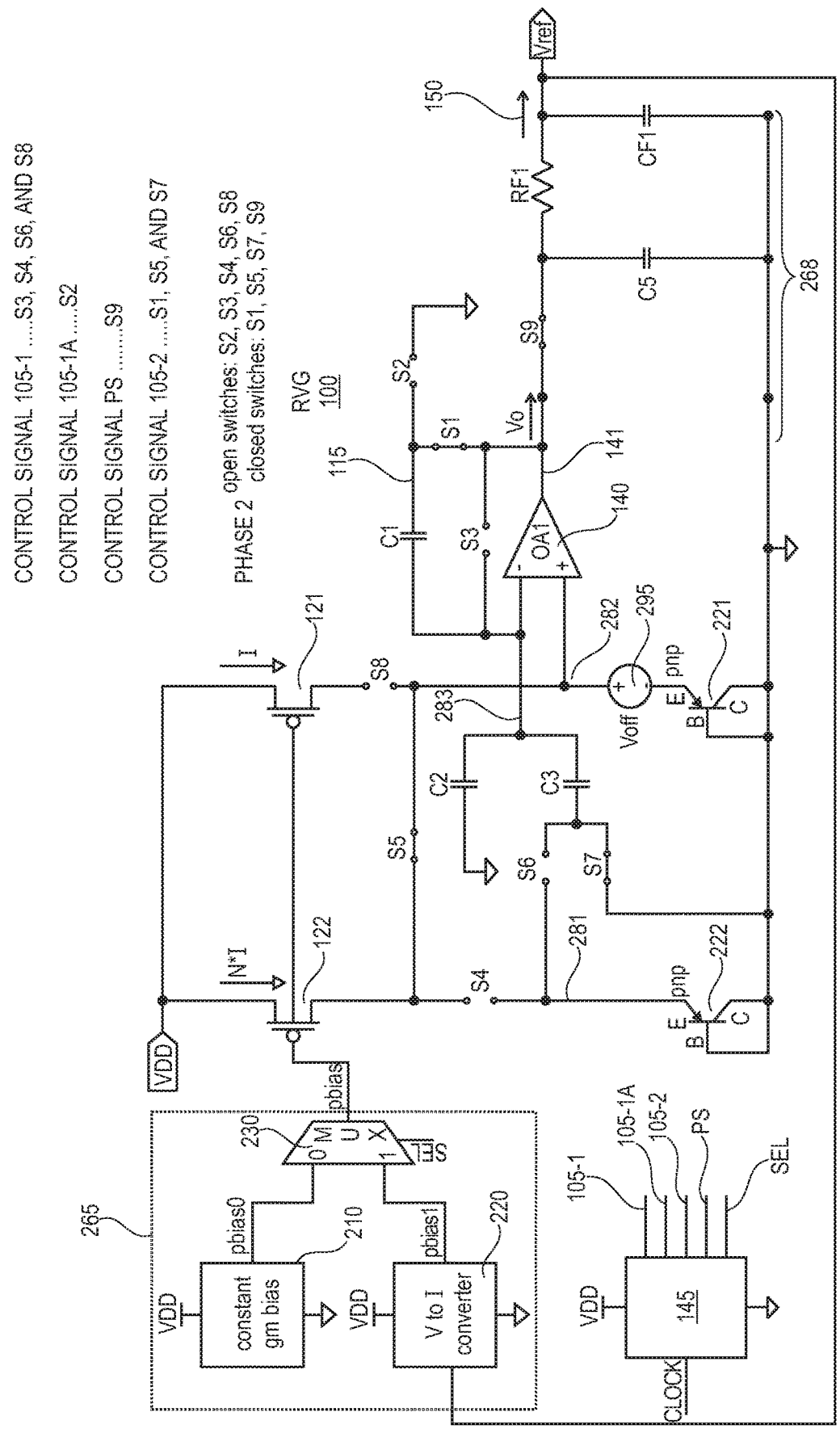
FIG. 6 is an example diagram illustrating operation and software settings of the reference voltage generator in a second mode (phase #2) according to embodiments herein.
Figure 7:
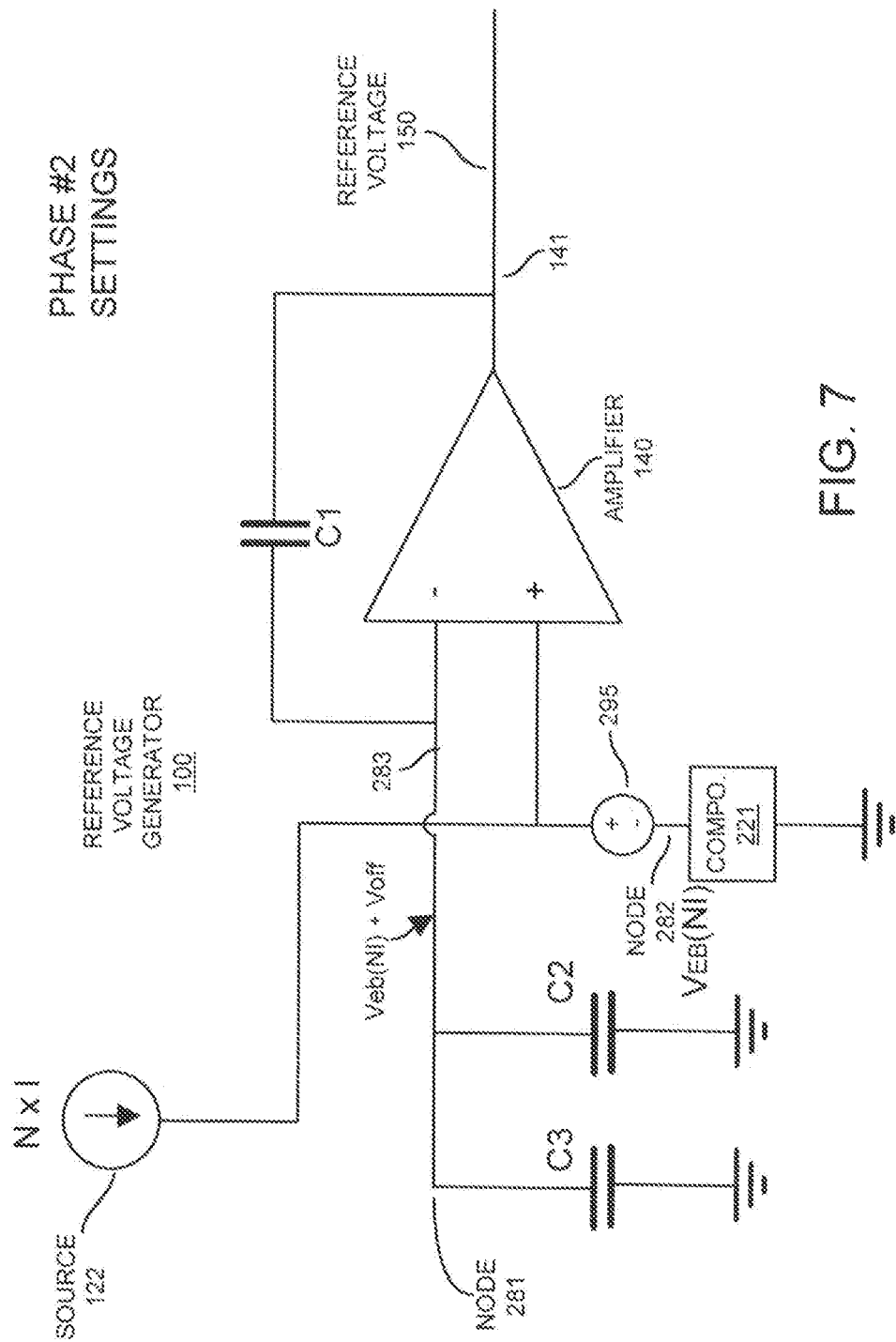
FIG. 7 is an example diagram illustrating connectivity of components in the reference voltage generator during the second mode (phase #2) according to embodiments herein.

Thus, for phase #1:

$$Qph1=[\{Veb(I)+Voff\}Veb(nI)]C3+[Veb(I)+Voff]C2+[Veb(I)+Voff]C1,$$

where Qph1=total charge of capacitors C1, C2, and C3 associated with phase 1. Note that this information will be used later in the discussion associated with FIG. 7, FIG. 6 is an example diagram illustrating operation of the reference voltage generator in a second mode (phase #2) according to embodiments herein.

In the second mode (phase #2), the switch controller 145 produces the control signals 105-1 and 105-1A to open switches S2, S3, S4, S6, and S8; the switch controller 145 produces the control signal 105-2 to close switches S1, S5, and S7.

While in the second mode, via the above switch settings, the switch control circuit 145 configures the amplifier 140 to operate in a gain mode in which the capacitor C1 is coupled in the feedback path 115 such as between the inverting input (−) of the amplifier 140 and the output 141 of the amplifier 140.

Further, while operating in the second mode, the switch control circuit 145 is operable to couple the second current driver 122 to the first component 221 through switch S5. The first current driver 121 is deactivated and/or disconnected from the second semiconductor device 122 via opened switch S8.

In such an instance, the second current driver 122 supplies the second current NxI through the first component 221 to generate a third voltage Veb(NI) at node 282 that is inputted to non-inverting input (+) of the amplifier 140. Further, in the second mode, note that the capacitor C1 is connected between the output 141 of the amplifier 140 and the inverting input (−) of the amplifier 140.

FIG. 7 is an example diagram illustrating connectivity of components in the reference voltage generator during the second mode (phase #2) according to embodiments herein.

Again, note that charge Q of a capacitor equals the voltage across the capacitor multiplied by the capacitance of the capacitor.

During phase #2, the voltage at the non-inverting node of the amplifier 140 is Veb(NI)+Voffset. Because the amplifier 140 is balanced and is operating in the gain mode, the inverting input (−) or node 283 of the amplifier 140 is also Veb(NI)+Voffset.

For phase #2:

$$Qph2=[Veb(nI)+Voff]C3+[Veb(nI)+Voff]C2+[\{Veb(nI)+Voff\}Vo]C1$$

where Qph2=the total charge associated with capacitors C1, C2, and C3 in phase 2.

Via conservation of charge when switching from phase #1 and phase #2, Qph1=Qph2. Accordingly, $$[\{Veb(I)+Voff\}-Veb(nI)]C3+[Veb(I)+Voff]C2+[Veb(I)+Voff]C1==[Veb(nI)+Voff]C3+[Veb(nI)+Voff]C2+[\{Veb(nI)+Voff\}-Vo]C1$$

Solving for Vref (or Vo), the equations reduce to:

$$Vref=[(C3+C2+C1)/C1]\Delta Vbe+(C3/C1)Veb(nI),$$

where ΔVbe=Veb(nI)−Veb(I)

As previously discussed, the settings of the capacitors C1, C2, and C3 can be chosen to produce a voltage reference at a desired setpoint.

Figure 8A:
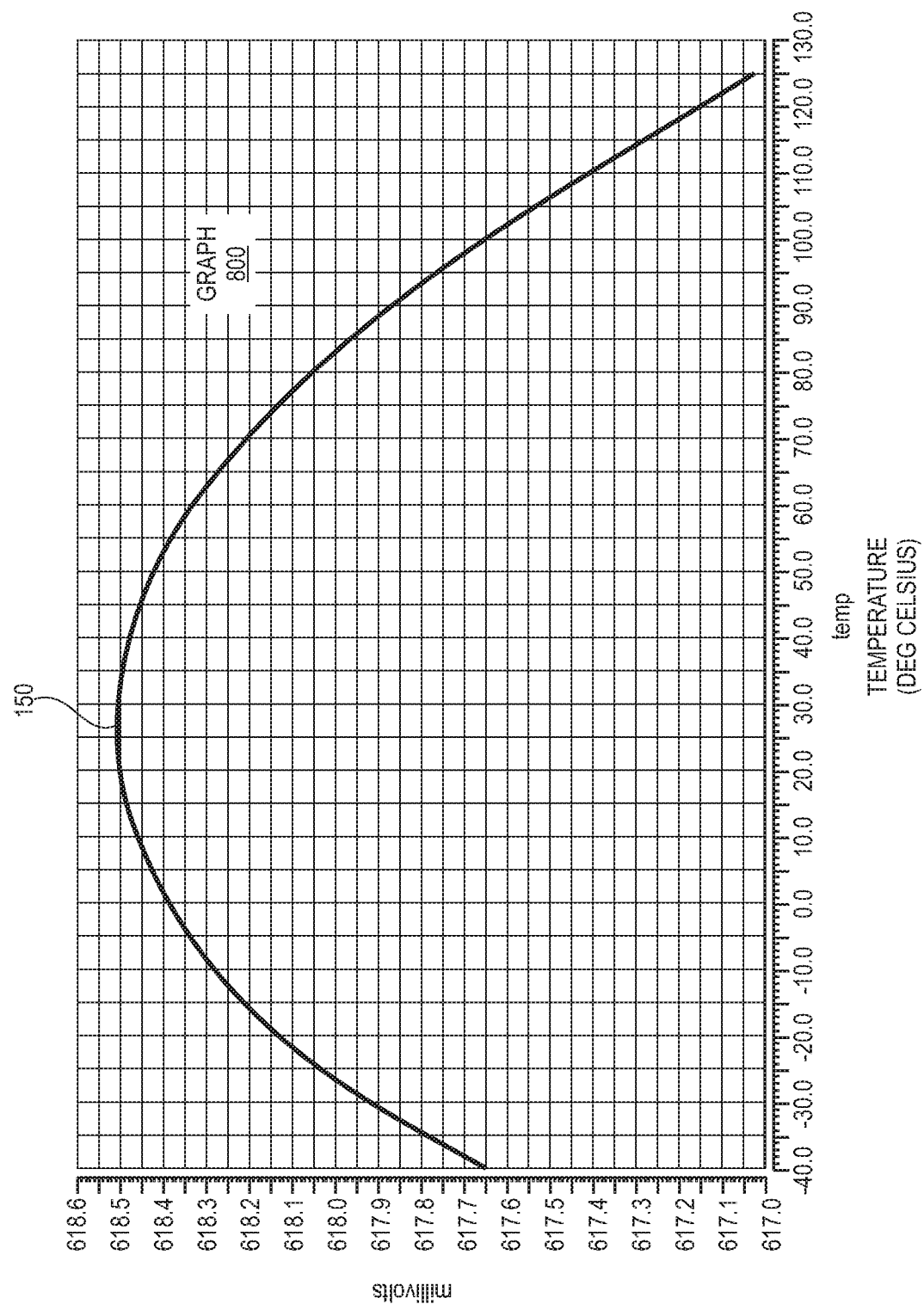
FIG. 8A is an example diagram illustrating a magnitude of the generated reference voltage over a range of temperature according to embodiments herein.

FIG. 8A is an example diagram illustrating a theoretical magnitude of the generated reference voltage over a range of temperatures according to embodiments herein.

In this example embodiment, a magnitude of the reference voltage 150 is substantially constant over a range of temperatures. By way of non-limiting example embodiment, the magnitude of the reference voltage is less than 1 VDC (Volts DC), although the magnitude of the reference voltage 150 can be any suitable value.

More specifically, as indicated by graph 800, the magnitude of the reference voltage 150 varies between 617 and 618.5 millivolts over a wide range of temperatures (such as −40 degrees Celsius and 125 degrees Celsius).

Figure 8B:
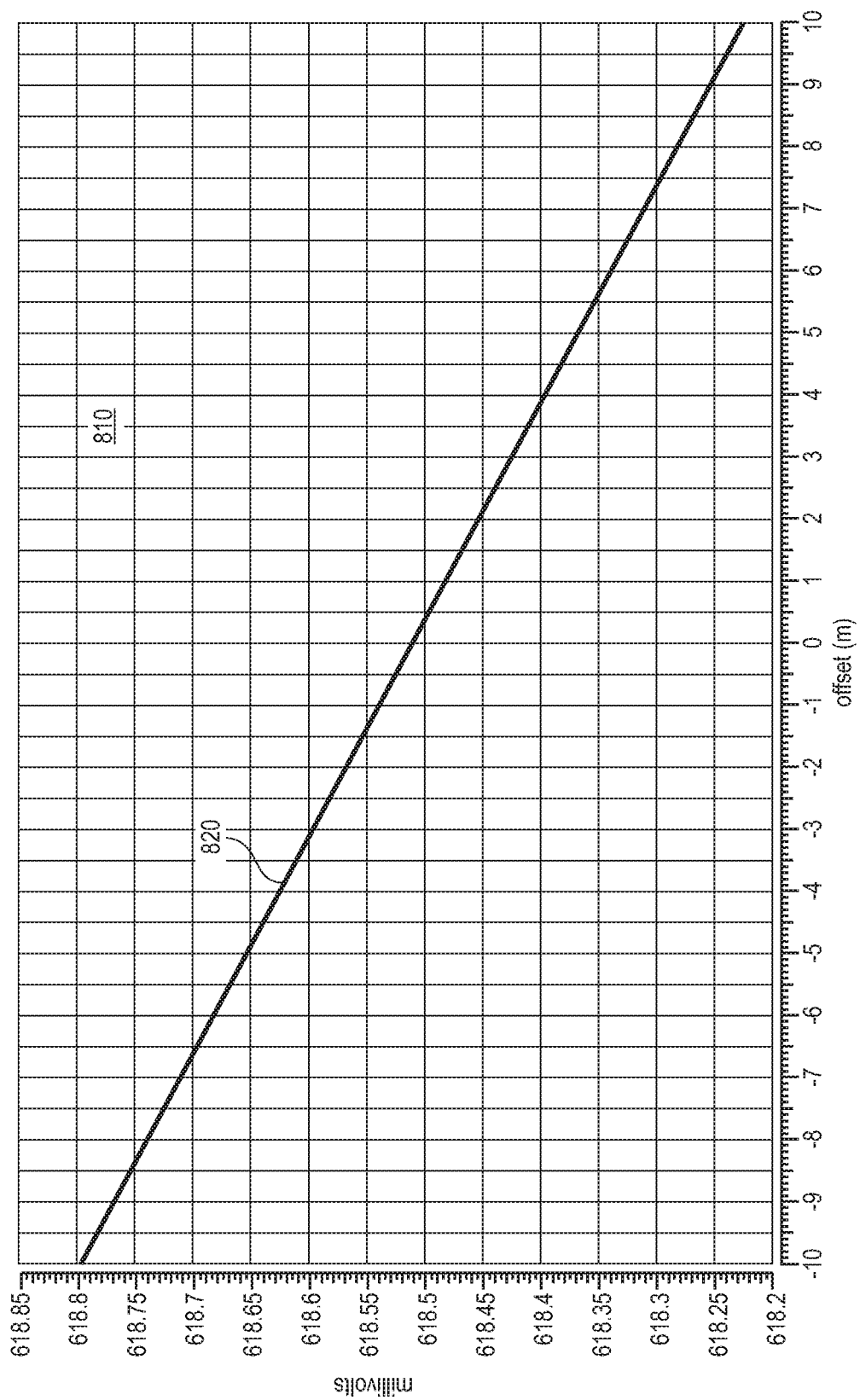
FIG. 8B is an example diagram illustrating a magnitude of an output voltage over different offset voltages according to embodiments herein.

FIG. 8B is an example diagram illustrating that a magnitude of the output voltage is substantially constant over different offset voltages according to embodiments herein.

In general, graph 810 and line 820 (representing reference voltage 150) illustrates the change in magnitude of the output reference voltage 150 versus change in input offset voltage.

As shown, the offset voltage is swept from −10 mV to +10 mV. The Voffset labelled 295 in FIG. 4 and the offset voltage of the operational amplifier in FIG. 2B are being swept simultaneously. The output reference voltage 150 (Vref) is seen to have an almost constant value of 0.618V. There is very slight deviation in Vref, which illustrates that the auto zero method of offset (switching of capacitor C1) cancellation works correctly.

Figure 8C:
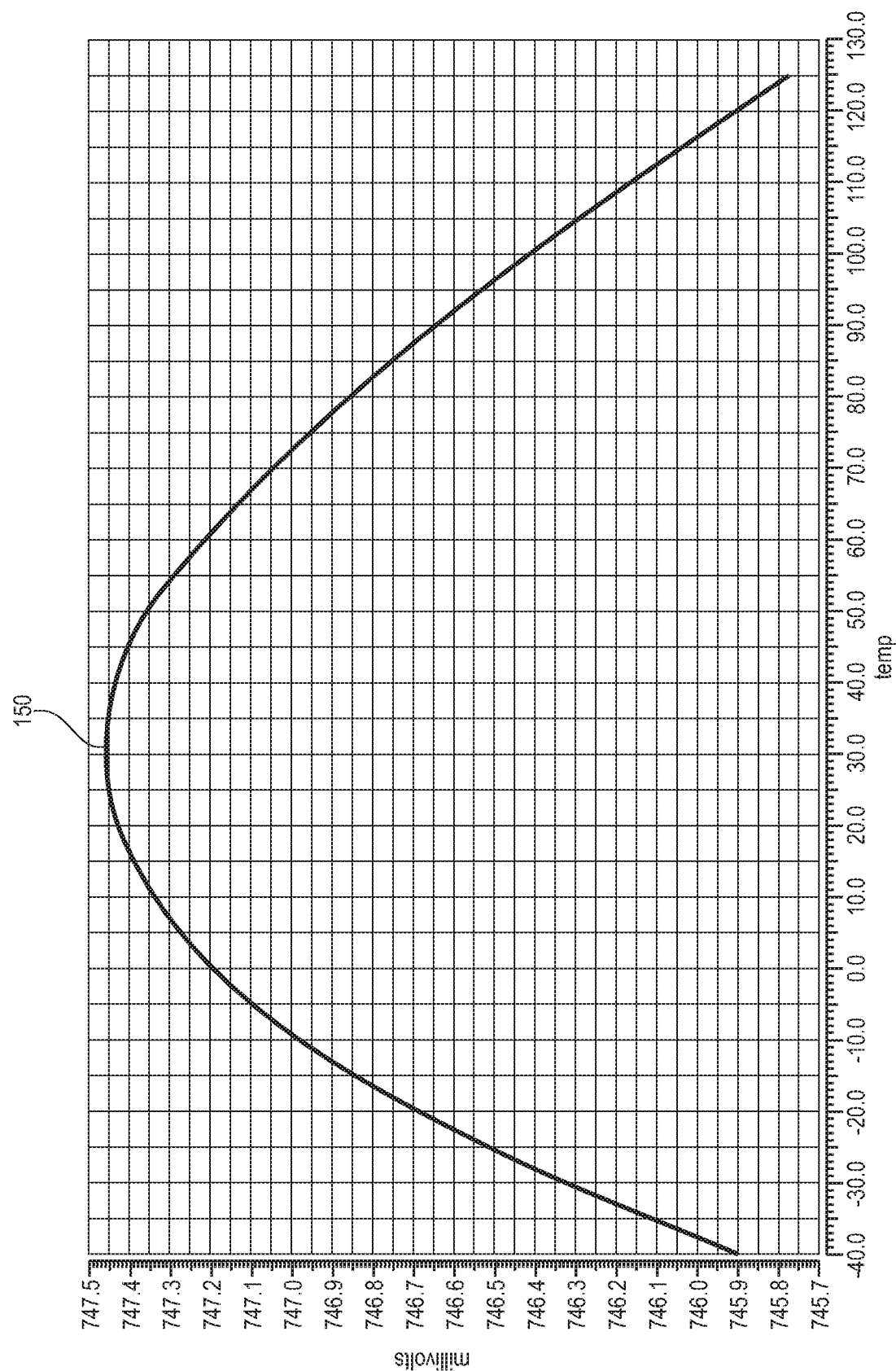
FIG. 8C is an example diagram illustrating a magnitude of the generated reference voltage over a range of temperature according to embodiments herein.

FIG. 8C illustrates the temperature behavior of the output voltage reference 150 set to the target voltage of 747 mV at room temperature according to embodiments herein. In this example embodiment, C1=1 pF, C3=0.6 pF and the best suitable value for C2 was found to be 4.8 pF.

To set the target output voltage to a different voltage such as 1.2 VDC, embodiments herein include choosing C1=C3=1 pF. In such an instance, a circuit designer implementing the reference voltage generator 100 selects a suitable value of C2 to get a suitable temperature behavior of the output reference voltage. Note that the supply voltage for the circuit will have to be greater than 1.2 VDC in this situation to accommodate generating the 1.2 VDC reference voltage.

Figure 9:
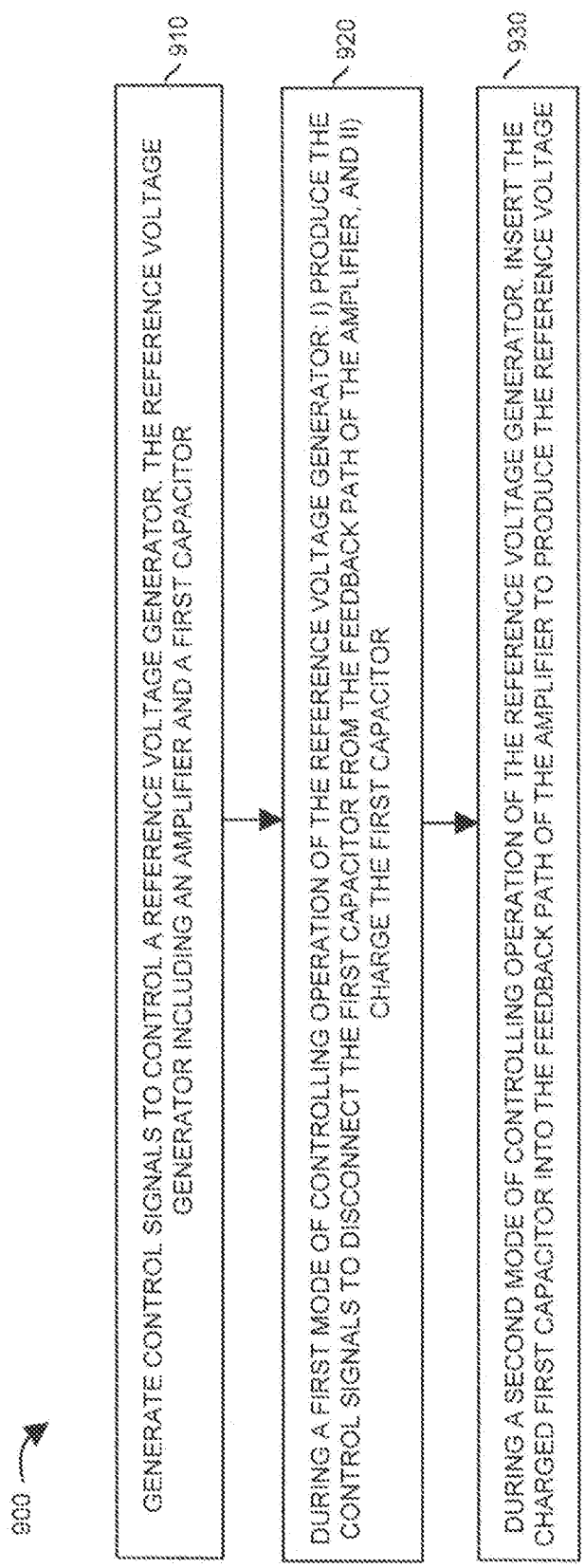
FIG. 9 is an example diagram illustrating a method of generating a reference voltage according to embodiments herein.

FIG. 9 is a flowchart 900 illustrating an example method according to embodiments herein. Note that there will be some overlap with respect to concepts as discussed above.

In processing operation 910, the switch controller 145 generates control signals 105 105-1A, etc., to control the switch network (such as switches S1, S2, etc.) of the reference voltage generator 100. As previously discussed, in one embodiment, the reference voltage generator 100 includes an amplifier 140 and a capacitor C1.

In processing operation 920, during a first mode (such as phase #1) of controlling operation of the reference voltage generator 100, the switch controller 145: i) produces the control signals 105 to disconnect the capacitor C1 from the feedback path 115 of the amplifier 140, and ii) charges the capacitor C1.

In processing operation 930, during a second mode (such as phase #2) of controlling operation of the reference voltage generator 100: the switch controller 145 produces the control signals 105 to insert the capacitor C1 into the feedback path of the amplifier 140 to produce the reference voltage 150.

Note again that techniques herein are well suited for use in generation of an accurate reference voltage. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure the claimed subject matter.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

I claim:

1. A reference voltage generator comprising:
    an amplifier;
    a first capacitor;
    a second capacitor; and
    a switch controller operable to control connectivity of the first capacitor in a feedback path of the amplifier to generate a reference voltage, the switch controller operable to switch between: i) a first mode in which the first capacitor is absent from the feedback path of the amplifier during charging of the first capacitor, and ii) a second mode of inserting the charged first capacitor into the feedback path of the amplifier; and
    wherein the first capacitor and the second capacitor are connected in parallel during the first mode.

2. The reference voltage generator as in claim 1, wherein the first mode includes operating the amplifier in a unity gain mode in which an output of the amplifier is coupled to an inverting input of the amplifier; and
    wherein the second mode includes operating the amplifier in a gain mode in which the first capacitor is coupled between the inverting input of the amplifier and the output of the amplifier.

3. The reference voltage generator as in claim 2, further comprising:
    a first semiconductor device;
    a first current driver; and
    wherein, during the first mode, the switch controller is operable to couple the first current driver to the first semiconductor device, the first current driver supplying first current through the first semiconductor device during the first mode to generate a first voltage applied to the non-inverting input of the amplifier.

4. The reference voltage generator as in claim 3, further comprising:
    a third capacitor;
    a second semiconductor device;
    a second current driver; and
    wherein, during the first mode: the switch controller is operable to couple the second current driver to the second semiconductor device, the second current driver supplying second current through the second semiconductor device during the first mode to generate a second voltage inputted to the third capacitor, the third capacitor disposed between the second semiconductor device and an inverting input of the amplifier.

5. The reference voltage generator as in claim 4, wherein, during the second mode, the switch controller is operable to couple the second current driver to the first semiconductor device, the current driver supplying current through the first semiconductor device in the second mode to generate a third voltage applied to the non-inverting input of the amplifier.

6. The reference voltage generator as in claim 4, wherein an area factor of the first semiconductor device is substantially equal to an area factor of the second semiconductor device.

7. The reference voltage generator as in claim 4, further comprising:
    a biasing circuit operable to switch between driving the first current driver and the second current driver based on a first bias signal and a second bias signal, the first bias signal initializing operation of the reference voltage generator to produce the reference voltage, the second bias signal generated via a voltage to current converter.

8. The reference voltage generator as in claim 1, wherein a magnitude of the reference voltage is substantially constant over a range of temperatures; and
    wherein a magnitude of the reference voltage is less than 1 VDC.

9. The reference voltage generator as in claim 1, further comprising:
    a third capacitor; and
    wherein each of the first capacitor, the second capacitor, and the third capacitor is coupled to an inverting input of the amplifier; and
    wherein the second capacitor and the third capacitor are connected in parallel during the second mode.

10. The reference voltage generator as in claim 1, wherein the second capacitor is coupled to the amplifier, a setting of the second capacitor selected to provide first order temperature compensation of generating the reference voltage across a range of different temperatures.

11. The reference voltage generator as in claim 1, further comprising:
    a third capacitor, the first capacitor and the third capacitor being connected in parallel during the second mode.

12. The reference voltage generator as in claim 11, wherein each of the first capacitor, the second capacitor, and the third capacitor is coupled to an inverting input of the amplifier; and
    wherein the feedback path extends between an output of the amplifier and an inverting input node of the amplifier.

13. The reference voltage generator as in claim 1, wherein each of the first capacitor, the second capacitor, and a third capacitor is coupled to an inverting input of the amplifier; and wherein the first capacitor and the second capacitor are connected in parallel to a ground reference voltage during the first mode; and wherein the second capacitor and the third capacitor are connected in parallel to the ground reference voltage during the second mode.

14. The reference voltage generator as in claim 5, wherein each of the first capacitor, the second capacitor, and the third capacitor is coupled to an inverting input of the amplifier; and wherein the first capacitor and the second capacitor are connected in parallel to a ground reference voltage during the first mode; and wherein the second capacitor and the third capacitor are connected in parallel to the ground reference voltage during the second mode.

15. The reference voltage generator as in claim 1, further comprising:

a third capacitor;

wherein a voltage of a non-inverting input node of the amplifier in the first mode is Veb(I)+Voffset, where Veb(I) is a voltage produced by supplying current I through a first circuit component, where Voffset is an input offset voltage of the amplifier;

wherein the voltage of the non-inverting input node of the amplifier in the second mode is Veb(nl)+Voffset, where Veb(nl) is a voltage produced by supplying current nl through the first circuit component;

where C1=a capacitance of the first capacitor;
where C2=a capacitance of the second capacitor;
where C3=a capacitance of the third capacitor;
wherein, for the first mode:

$$Qph1=[\{Veb(I)+Voffset\}-Veb(nl)]C3+[Veb(I)+Voffset]C2+[Veb(I)+Voffset]C1, \text{ where } Qph1=\text{total charge of the first capacitor, the second capacitor and the third capacitor;}$$

wherein, for the second mode:

$$Qph2=[Veb(nl)+Voff]C3+[Veb(nl)+Voff]C2+[\{Veb(nl)+Voff\}-Vo]C1, \text{ where } Qph2=\text{the total charge of the first capacitor, the second capacitor and the third capacitor.}$$

16. The reference voltage generator as in claim 15, wherein the total charge is conserved between switching from the first mode to the second mode in which Qph1=Qph2, wherein:

$$[\{Veb(I)+Voff\}-Veb(nl)]C3+[Veb(I)+Voff]C2+[Veb(I)+Voff]C1==[Veb(nl)+Voff]C3+[Veb(nl)+Voff]C2+[\{Veb(nl)+Voff\}-Vref]C1.$$

17. The reference voltage generator as in claim 16, wherein:

$$Vref=[(C3+C2+C1)/C1]\Delta Vbe+(C3/C1)Veb(nl),$$

where $\Delta Vbe=Veb(nl)-Veb(I)$, and Vref=a magnitude of the reference voltage.

18. A reference voltage generator comprising:
an amplifier;
a first capacitor; and
a switch controller operable to control connectivity of the first capacitor in a feedback path of the amplifier to generate a reference voltage, the switch controller operable to switch between: i) a first mode in which the first capacitor is absent from the feedback path of the amplifier during charging of the first capacitor, and ii) a second mode of inserting the charged first capacitor into the feedback path of the amplifier;

the reference voltage generator further comprising:
a second capacitor;
a first current driver;
a first semiconductor device;
a second current driver;
a second semiconductor device; and
wherein, during the first mode, the switch controller is operable to: i) couple the first current driver to the first semiconductor device to generate a first voltage applied to a non-inverting input of the amplifier, and ii) couple the second current driver to the second semiconductor device to generate a second voltage inputted to the second capacitor, the second capacitor coupled to an inverting input of the amplifier;

the reference voltage generator further comprising: a third capacitor; and wherein during the second mode, the switch controller is operable to couple the second current driver to the first semiconductor device to generate a third voltage, the third voltage being applied to the non-inverting input of the amplifier.

19. A reference voltage generator comprising:
an amplifier;
a first capacitor; and
a switch controller operable to control connectivity of the first capacitor in a feedback path of the amplifier to generate a reference voltage, the switch controller operable to switch between: i) a first mode in which the first capacitor is absent from the feedback path of the amplifier during charging of the first capacitor, and ii) a second mode of inserting the charged first capacitor into the feedback path of the amplifier;

the reference voltage generator further comprising:
a second capacitor;
a first current driver;
a first semiconductor device;
a second current driver;
a second semiconductor device; and
wherein, during the first mode, the switch controller is operable to: i) couple the first current driver to the first semiconductor device to generate a first voltage applied to a non-inverting input of the amplifier, and ii) couple the second current driver to the second semiconductor device to generate a second voltage inputted to the second capacitor, the second capacitor coupled to an inverting input of the amplifier, the method further comprising:

a third capacitor; and
wherein during the second mode, the switch controller is operable to: i) couple the second current driver to the first semiconductor device to generate a third voltage applied to the non-inverting input of the amplifier, and ii) couple the second capacitor in parallel with the third capacitor.

20. The reference voltage generator as in claim 19, wherein the first current driver is operable to output a first constant current during the first mode; and wherein the second current driver is operable to output a second constant current during the first mode and the second mode, the second constant current substantially greater than the first constant current.

21. The reference voltage generator as in claim 20, wherein the first semiconductor device and the second semiconductor device have a substantially same area factor.

22. A method comprising:
generating control signals to control a reference voltage generator, the reference voltage generator including an amplifier and a first capacitor, generation of the control signals including:
during a first mode of controlling the reference voltage generator: i) producing the control signals to disconnect the first capacitor from a feedback path of the amplifier, ii) charging the first capacitor, and iii) inputting a first voltage to a non-inverting input of the amplifier; and
during a second mode of controlling the reference voltage generator: i) inserting the first capacitor into the feedback path of the amplifier to produce a reference voltage, and ii) inputting a second voltage to the non-inverting input of the amplifier;
wherein generating control signals includes: during the first mode, controlling a switch network of the reference voltage generator to: i) couple a first current driver of the reference voltage generator to a first semiconductor device to generate the first voltage inputted to the non-inverting input of the amplifier ii) couple a second current driver of the reference voltage generator to a second semiconductor device to generate a third voltage inputted to a second capacitor of the reference voltage generator, the second capacitor coupled between the second semiconductor device and the inverting input of the amplifier, the method further comprising:
during the second mode, controlling the switch network of the reference voltage generator to: i) couple the second current driver to the first semiconductor device to generate the second voltage inputted to the non-inverting input of the amplifier, and ii) couple the second capacitor in parallel with a third capacitor of the reference voltage generator.

23. The method as in claim 22, wherein controlling the reference voltage generator during the first mode includes: controlling the first current driver to drive first current through a semiconductor device to generate the first voltage; and
wherein controlling the reference voltage generator during the second mode includes: controlling the second current driver to drive second current through the semiconductor device to generate the second voltage, a magnitude of the second current substantially different than a magnitude of the first current.

24. The method as in claim 22, further comprising:
during the first mode: operating the amplifier in a unity gain mode in which an output of the amplifier is coupled to an inverting input of the amplifier; and
during the second mode: operating the amplifier in a gain mode in which the first capacitor is coupled between the inverting input of the amplifier and the output of the amplifier.

25. The method as in claim 24, further comprising:
during the first mode: coupling the first current driver of the reference voltage generator to the first semiconductor device, the first current driver supplying first current through the first semiconductor device during the first mode to generate the first voltage inputted to the non-inverting input of the amplifier.

26. The method as in claim 25, further comprising:
during the first mode: coupling the second current driver of the reference voltage generator to the second semiconductor device, the second current driver supplying second current through the second semiconductor device during the first mode to generate the third voltage inputted to the second capacitor coupled between the second semiconductor device and the inverting input of the amplifier.

27. The method as in claim 26, wherein an area factor of the first semiconductor device is substantially equal to an area factor of the second semiconductor device.

28. The method as in claim 22, further comprising:
switching between operating the reference voltage generator in the first mode and the second mode to produce the reference voltage to be of substantially constant magnitude over a range of temperatures.

29. The method as in claim 22, further comprising:
controlling the first current driver to output a first constant current during the first mode; and
controlling the second current driver to output a second constant current during the first mode and the second mode, the second constant current being substantially greater in magnitude than the first constant current.

* * * * *

UNITED STATES PATENT AND TRADEMARK OFFICE
CERTIFICATE OF CORRECTION

PATENT NO. : 10,852,758 B2  
APPLICATION NO. : 16/238776  
DATED : December 1, 2020  
INVENTOR(S) : Salil A. Mahadik It is certified that error appears in the above-identified patent and that said Letters Patent is hereby corrected as shown below:

In the Claims

Claim 15, Column 13  
Line 26, delete "(n1)", insert --(nI)--  
Line 27, delete "Veb(n1) is a voltage produced by supplying current n1", insert --Veb(nI) is a voltage produced by supplying current nI--  
Line 33, delete "Veb(n1)", insert --Veb(nI)--  
Line 39, delete "Qph2 = [Veb(nl) + Voff]C3 + [Veb(nl)", insert --Qph2 = [Veb(nI) + Voff]C3 + [Veb(nI)--  
Line 40, delete "(n1)", insert --(nI)--

Claim 16, Column 13  
Line 47, delete "– Veb(nl)", insert --Veb(nI)--  
Line 48, delete "= = [Veb(nl)+Voff]C3+[Veb(nl)+Voff]", insert --= = [Veb(nI)+Voff]C3+[Veb(nI)+Voff]--  
Line 49, delete "Veb(nl)", insert --Veb(nI)--

Claim 17, Column 13  
Line 53, delete "Vref = [(C3 + C2 + C1)/C1] ΔVbe + (C3/C1) Veb(nl)", insert --Vref = [(C3 + C2 + C1)/C1] ΔVbe + (C3/C1) Veb(nI)--  
Line 55, delete "= Veb(nl) – Veb(I)", insert --= Veb(nI) – Veb(I)--

Signed and Sealed this  
Sixteenth Day of February, 2021

Drew Hirshfeld  
*Performing the Functions and Duties of the*  
*Under Secretary of Commerce for Intellectual Property and*  
*Director of the United States Patent and Trademark Office*